(12) United States Patent
Mahler et al.

(10) Patent No.: US 8,187,964 B2
(45) Date of Patent: May 29, 2012

(54) INTEGRATED CIRCUIT DEVICE AND METHOD

(75) Inventors: Joachim Mahler, Regensburg (DE); Thomas Behrens, Wenzenbach (DE); Ivan Galesic, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 115 days.

(21) Appl. No.: 12/581,573

(22) Filed: Oct. 19, 2009

(65) Prior Publication Data

US 2010/0099223 A1 Apr. 22, 2010

Related U.S. Application Data

(62) Division of application No. 11/933,459, filed on Nov. 1, 2007, now abandoned.

(51) Int. Cl.
*H01L 21/44* (2006.01)
(52) U.S. Cl. ...................................... 438/612
(58) Field of Classification Search ............ 438/612
See application file for complete search history.

(56) References Cited

U.S. PATENT DOCUMENTS

| | | |
|---|---|---|
| 4,111,775 A | 9/1978 | Hollis, Jr. et al. |
| 4,168,330 A | 9/1979 | Kaganowicz |
| 4,293,587 A | 10/1981 | Trueblood |
| 4,446,194 A | 5/1984 | Candelaria et al. |
| 4,587,710 A | 5/1986 | Tsao |
| 4,673,248 A | 6/1987 | Taguchi et al. |
| 4,751,196 A | 6/1988 | Pennell et al. |
| 4,914,742 A | 4/1990 | Higashi et al. |
| 4,916,014 A | 4/1990 | Weber et al. |
| 4,933,090 A | 6/1990 | Gill et al. |
| 4,988,164 A | 1/1991 | Ichikawa |
| 5,061,739 A | 10/1991 | Shimizu |
| 5,469,019 A | 11/1995 | Mori |
| 5,472,902 A | 12/1995 | Lur |
| 5,618,761 A | 4/1997 | Eguchi et al. |
| 5,627,106 A | 5/1997 | Hsu |
| 5,691,240 A | 11/1997 | Yang |
| 5,773,197 A | 6/1998 | Carter et al. |
| 5,824,578 A | 10/1998 | Yang |
| 5,935,702 A | 8/1999 | Macquart et al. |
| 6,011,291 A | 1/2000 | Russell et al. |
| 6,054,769 A | 4/2000 | Jeng |
| 6,130,472 A * | 10/2000 | Feger et al. .................... 257/643 |
| 6,454,956 B1 | 9/2002 | Engelhardt et al. |
| 6,946,403 B2 | 9/2005 | Kellerman et al. |
| 7,008,596 B1 | 3/2006 | Rump et al. |
| 7,074,664 B1 | 7/2006 | White et al. |
| 7,115,526 B2 | 10/2006 | Ho et al. |
| 7,158,364 B2 | 1/2007 | Miyauchi et al. |
| 7,160,823 B2 | 1/2007 | Park et al. |
| 7,161,795 B1 | 1/2007 | Megherhi et al. |
| 7,169,223 B1 | 1/2007 | Pfaff et al. |
| 7,175,786 B2 | 2/2007 | Celikkaya et al. |
| 7,189,651 B2 | 3/2007 | Yoshioka et al. |

(Continued)

FOREIGN PATENT DOCUMENTS

CN 1564308 A 1/2005

(Continued)

*Primary Examiner* — Jenny L Wagner
(74) *Attorney, Agent, or Firm* — Dicke, Billig & Czaja, PLLC

(57) ABSTRACT

An integrated circuit device includes a semiconductor chip with a metallization layer on the chip. A gas-phase deposited insulation layer is disposed on the metallization layer.

17 Claims, 3 Drawing Sheets

U.S. PATENT DOCUMENTS

| | | | |
|---|---|---|---|
| 7,233,000 B2 | 6/2007 | Nassiopoulou et al. | |
| 7,235,117 B2 | 6/2007 | Therani | |
| 7,361,555 B2 | 4/2008 | Koops et al. | |
| 7,399,704 B2 * | 7/2008 | Fujii et al. | 438/674 |
| 2001/0003379 A1 | 6/2001 | Seo | |
| 2002/0163062 A1 | 11/2002 | Wang et al. | |
| 2003/0098489 A1 | 5/2003 | Amos et al. | |
| 2003/0146445 A1 | 8/2003 | Hen | |
| 2004/0126957 A1 | 7/2004 | Sezi | |
| 2005/0082591 A1 | 4/2005 | Hirler et al. | |
| 2006/0051602 A1 * | 3/2006 | Iacovangelo et al. | 428/472 |
| 2006/0222760 A1 | 10/2006 | Helneder et al. | |
| 2006/0232206 A1 | 10/2006 | Seo | |
| 2006/0233887 A1 | 10/2006 | Day | |
| 2006/0275617 A1 | 12/2006 | Miyoshi et al. | |
| 2007/0009767 A1 | 1/2007 | Minachi et al. | |
| 2007/0034945 A1 | 2/2007 | Bohr et al. | |
| 2007/0187295 A1 | 8/2007 | Giardino et al. | |
| 2008/0199723 A1 | 8/2008 | Cho et al. | |
| 2008/0303121 A1 | 12/2008 | Lin et al. | |
| 2009/0115287 A1 | 5/2009 | Kando | |
| 2009/0163641 A1 | 6/2009 | Oliveira et al. | |

FOREIGN PATENT DOCUMENTS

| | | | |
|---|---|---|---|
| CN | 1585571 A | 2/2005 | |
| CN | 1731582 A | 2/2006 | |
| DE | 2818624 A1 | 10/1979 | |
| DE | 2829779 A1 | 1/1980 | |
| DE | 3631758 A1 | 4/1987 | |
| DE | 3815569 A1 | 12/1988 | |
| DE | 289369 A5 | 4/1991 | |
| EP | 0212691 A1 | 3/1987 | |
| EP | 0247920 A1 | 12/1987 | |
| EP | 0348169 A2 | 12/1989 | |
| EP | 0466103 A1 | 1/1992 | |
| EP | 0517560 A2 | 12/1992 | |
| EP | 0523479 A2 | 1/1993 | |
| EP | 0523730 A1 | 1/1993 | |
| EP | 0584410 A1 | 3/1994 | |
| EP | 0726599 A2 | 8/1996 | |
| EP | 0768558 A2 | 4/1997 | |
| EP | 0872571 A1 | 10/1998 | |
| EP | 1061156 B1 | 12/2000 | |
| EP | 1122278 A2 | 8/2001 | |
| EP | 1260606 A2 | 11/2002 | |
| EP | 1744327 A1 | 1/2007 | |
| FR | 2819635 A1 | 7/2002 | |
| FR | 2849267 A1 | 6/2004 | |
| FR | 2869897 A1 | 11/2005 | |
| GB | 1502828 A | 3/1978 | |
| JP | 56051354 A | 5/1981 | |
| JP | 57146700 A | 9/1982 | |
| JP | 62083140 A | 4/1987 | |
| JP | 62197721 A | 9/1987 | |
| JP | 63300437 A | 12/1988 | |
| JP | 1031998 A | 2/1989 | |
| JP | 3008136 A | 1/1991 | |
| JP | 3061080 A | 3/1991 | |
| JP | 3189654 A | 8/1991 | |
| JP | 4023308 A | 1/1992 | |
| JP | 4053904 A | 2/1992 | |
| JP | 4076834 A | 3/1992 | |
| JP | 4077525 A | 3/1992 | |
| JP | 4134644 A | 5/1992 | |
| JP | 4246190 A | 9/1992 | |
| JP | 8088104 A | 4/1996 | |
| JP | 10144670 A | 5/1998 | |
| JP | 10289903 A | 10/1998 | |
| JP | 11274105 A | 10/1999 | |
| JP | 2000154349 A | 6/2000 | |
| JP | 2000236596 A | 8/2000 | |
| JP | 2003130895 A | 5/2003 | |
| JP | 2003247062 A | 9/2003 | |
| JP | 2005268576 A | 9/2005 | |
| JP | 2005268594 A | 9/2005 | |
| RU | 1752139 A1 | 12/1995 | |
| RU | 2117070 C1 | 8/1998 | |
| SE | 9704136 L | 4/1999 | |
| SU | 1534018 A1 | 1/1990 | |
| SU | 1620427 A1 | 1/1991 | |
| TW | 447047 B | 7/2001 | |
| TW | 591972 B | 6/2004 | |
| WO | 9211312 A1 | 7/1992 | |
| WO | 9220095 A1 | 11/1992 | |
| WO | 9308490 A1 | 4/1993 | |
| WO | 9957330 A1 | 11/1999 | |
| WO | 0154190 A1 | 7/2001 | |
| WO | 0194662 A1 | 12/2001 | |
| WO | 02077320 A1 | 10/2002 | |
| WO | 2004000960 A1 | 12/2003 | |
| WO | 2005024930 A2 | 3/2005 | |
| WO | 2005070989 A2 | 8/2005 | |
| WO | 2005080629 A2 | 9/2005 | |
| WO | 2006005067 A2 | 1/2006 | |

* cited by examiner

INTEGRATED CIRCUIT DEVICE AND METHOD

CROSS-REFERENCE TO RELATED APPLICATION

This application is a divisional application of co-pending U.S. patent application Ser. No. 11/933,459, Filed on Nov. 1, 2007, which is incorporated by reference in its entirety.

BACKGROUND

Semiconductor devices, such as integrated circuit (IC) packages, typically include one or more semiconductor devices arranged on a lead frame or carrier. The semiconductor device is attached to the lead frame, typically by an adhesive material or by soldering, and bond wires are attached to bond pads on the semiconductor devices and to lead fingers on the carrier to provide electrical interconnections between the various semiconductor devices and/or between a semiconductor device and the carrier. The device is then encapsulated in a plastic housing, for instance, to provide protection and form a housing from which the leads extend.

Such semiconductor packages typically include a semiconductor chip with a metallization layer formed over the chip to provide conductive paths and the conductive landings for the wire bonds, among other things. The metallization layer is often made up of multiple layers, such as copper, nickel-phosphorus, palladium and/or gold layers, for example. Applying the plastic encapsulation material directly over the metallization layer can result in electrical short circuits between different electrical potentials of the metallization layer, corrosion by and under the metallization, insufficient encapsulation compound and adhesive binding (resulting in delamination of the encapsulation material), etc.

Attempted solutions for such problems have been largely unsatisfactory. For example, a Polyimide coating is sometimes applied on the chip front metallization layer, but this also has disadvantages. For example, the high moisture content of the Polyimides can actually promote corrosion and contamination of the metallization, and the added layer of Polyimide might not provide the desired thermal conductivity. Moreover, the Polyimide material tends to be expensive.

For these and other reasons, there is a need for the present invention.

SUMMARY

In accordance with aspects of the present disclosure, an integrated circuit device includes a semiconductor chip with a metallization layer on the chip. A gas-phase deposited insulation layer is disposed on the metallization layer. In exemplary embodiments, this includes an inorganic material.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
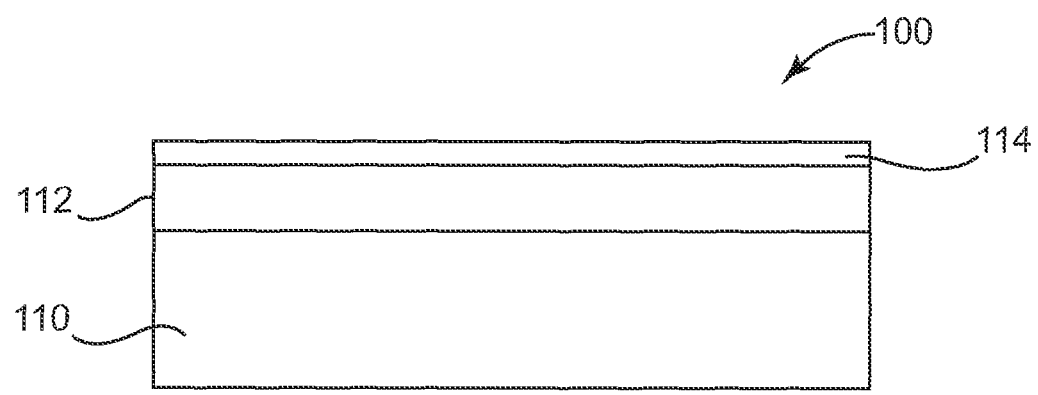
FIG. 1 is a block diagram conceptually illustrating a side view of an integrated circuit device.
Figure 2:
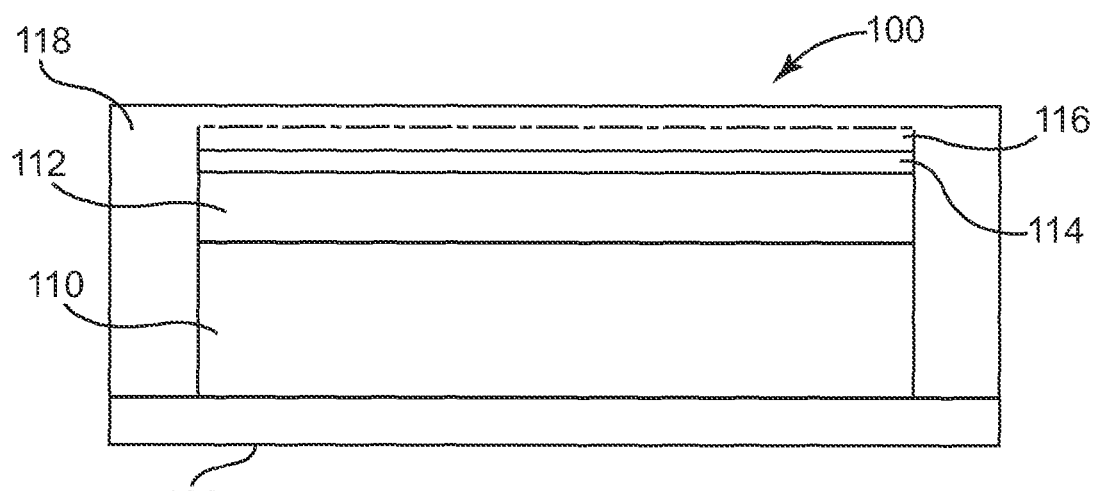
FIG. 2 is a block diagram conceptually illustrating further aspects of an integrated circuit device.

FIG. 1 is a schematic side view conceptually illustrating an integrated circuit device in accordance with embodiments of the present invention. The example integrated circuit device 100 includes a semiconductor device or chip 110, upon which a metallization layer 112 is deposited. An insulation layer 114 is deposited over the metallization layer, which among other things, protects the metallization 112. FIG. 2 illustrates further aspects of such an exemplary integrated circuit device 100, showing an additional layer 116 provided over the insulation layer in accordance with certain embodiments. The chip 110 is shown connected to a chip carrier or lead frame 120, and a molding material 118 encapsulates the device 100.

The metallization layer 112 may, for example, include multiple layers. For instance, the metallization layer 112 includes layers of copper, nickel-phosphorus, palladium and gold in some embodiments, forming a metallization layer having a thickness of more than 10 nm. As noted above, one purpose of the insulation layer 114 is protection of the metallization layer 112. However, if the material deposited to form the insulation layer 114 has a high moisture content, it can result in corrosion of the metallization layer 112 and can cause short circuits between areas of the metallization layer having different electrical potentials. Thus, the insulation layer 114 is made from a material that can be deposited on the metallization layer 112 in the gas phase, rather than applying the material in the liquid phase as with some known processes. The resulting insulation layer 114 has a thickness ranging from about 10 nm-20 µm, for example. Embodiments are envisioned wherein the thickness is about 1 µm, and provide a robust layer for protection of the metallization layer 114 and a surface that promotes adhesion of the molding material 118 or for additional semiconductors mounted on top of the device 100, as in a chip-on-chip arrangement.

Figure 3:
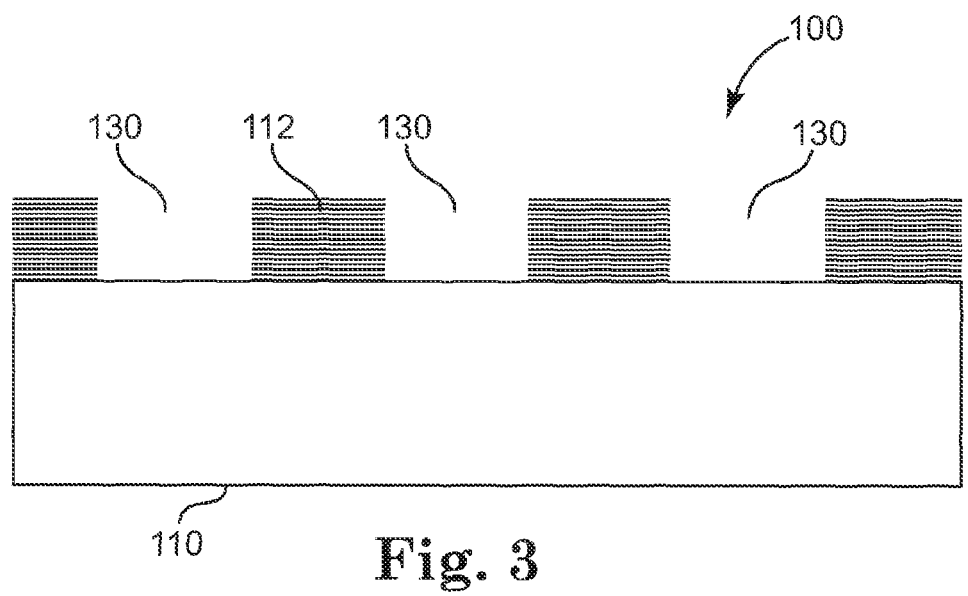
FIGS. 3-5 are block diagrams illustrating various portions of an integrated circuit device.
Figure 4:
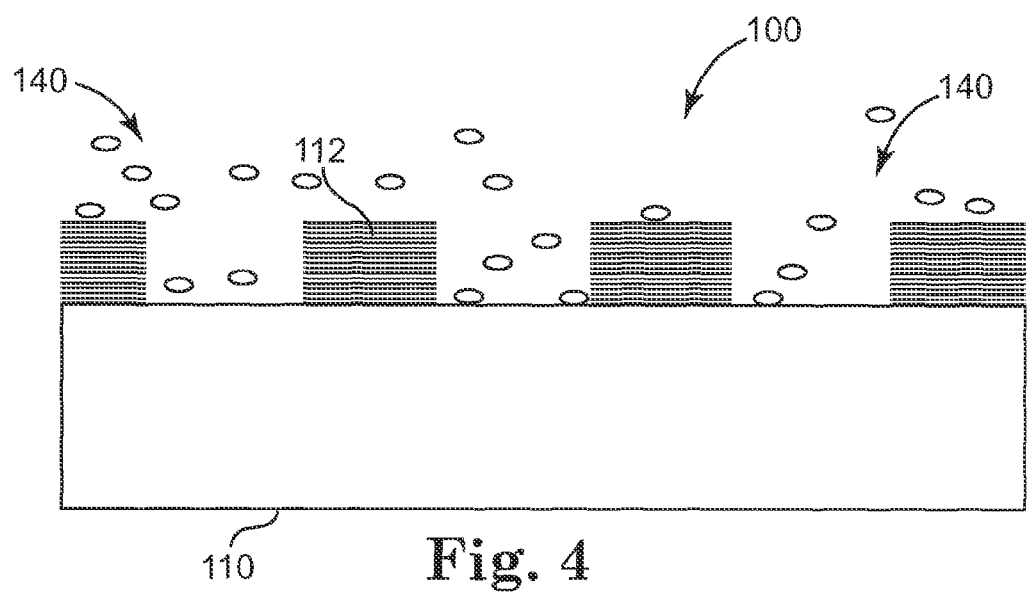
Figure 5:
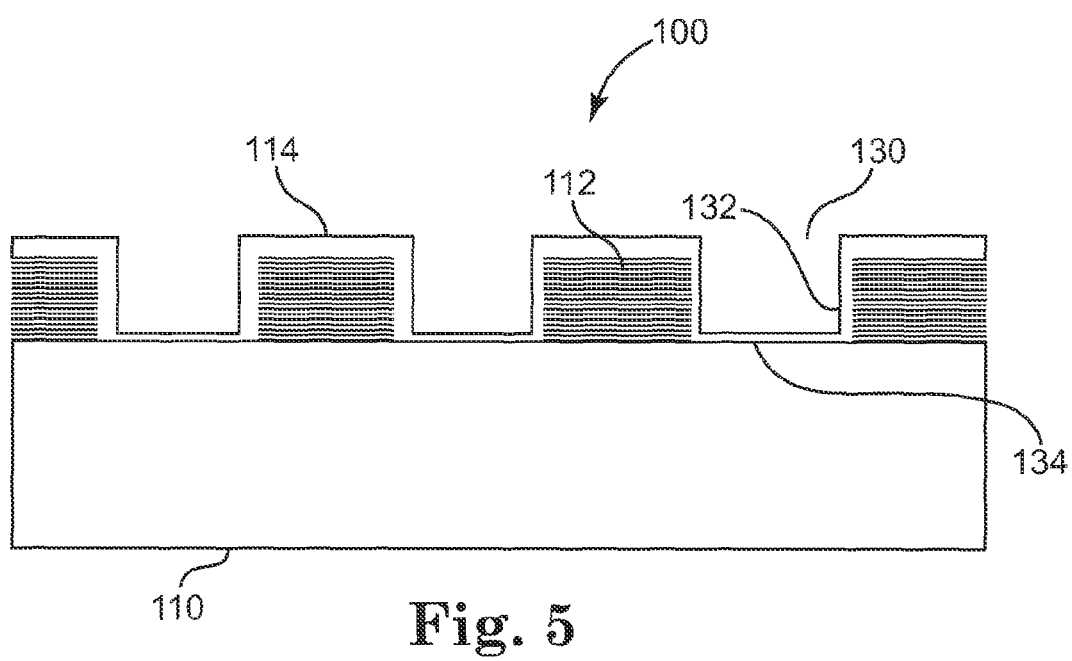

FIGS. 3-5 illustrate various aspects of the device 100. As shown in FIG. 3, the semiconductor chip 110 has the metallization layer 112 formed thereon. Metallization layer 112 provides, among other things, connection points for wire bonds or other conductors. In the illustrated embodiment, the metallization layer 112 has trenches 130 that are formed above the chip 110.

The insulation layer 114 is made, for example, from an inorganic or ceramic material deposited on the metallization layer 112 in the gas phase. FIG. 4 conceptually illustrates the deposition of inorganic precursors 140 from the gas phase, using a suitable gas-phase deposition process such as a chemical vapor deposition (CVD) process or a plasma enhanced chemical vapor deposition (PE-CVD) process, resulting in the desired inorganic material for the isolation layer 114. Suitable inorganic precursors include, for example, Silane or Titanate.

FIG. 5 illustrates the gas-phase deposited insulation layer 114 on the metallization layer 112, including sidewalls 132 and the bottom floor 134 of the trenches 130. As noted above, the insulation layer 114 is made of an inorganic material in exemplary embodiments, including silica, silica nitride, CVD diamond, titanium dioxide, or zirconium oxide, for example. In further embodiments, the gas-phase deposited layer includes a ceramic material, such as diamond-like carbon (DLC). Generally, the term diamond-like carbon (DLC) refers to any one of the seven forms of amorphous carbon material having an $sp^3$ lattice structure, or a modified $sp^3$ lattice structure including an $sp^2$ lattice portion of carbon bonds, that displays some of the physical properties of natural diamond. The material resulting in the gas-phase deposited insulation layer has a low moisture content, at least reducing the likelihood of short circuits or corrosion on the metallization layer 112.

In still further embodiments, the insulation layer 114 includes amorphous carbon with further inserted elements, such as silicon, hydrogen and/or oxygen. The added elements can be added in ratio so as to achieve the same, or a similar, coefficient of thermal expansion (CTE) as the chip 110, which substantially reduces thermal stress. Moreover, such an amorphous inorganic insulation layer, or a ceramic carbon type layer has a temperature stability up to 450-500° C.

In other embodiments, the insulation layer 114 is made from an organic polymeric material, such as plasma generated polymers like Parylene or Teflon. Such materials prevent or reduce the likelihood of contamination of the metallization layer 114 and also provide electrical insulation. They take up very little moisture and are comparatively elastic, buffering thermomechanical stresses.

To improve the adhesion of the molding compound 118 or other adhesives on such polymer layers, a locking plasma treatment process, in particular with oxygen may be used. In other implementations, a thin (1-10 nm, for example) adhesion-promoting layer (such as the layer 116 illustrated in FIG. 2) using a material such as a silane is deposited on the insulation layer 114 from the gas phase.

A mask layer can be used to structure the insulation layer 114, or the insulation layer 114 can be structured using a suitable photolithography process. In further embodiments, a laser ablation process can be used to structure the insulation layer.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for producing an integrated circuit device, comprising:
   providing a semiconductor chip;
   applying a metallization layer directly to a top surface of the semiconductor chip; and
   applying an insulation layer including an inorganic precursor directly on the metallization layer by a gas-phase deposition such that the insulation layer contacts the metallization layer,
   wherein the insulation layer includes amorphous carbon.

2. The method of claim 1, further comprising structuring the insulation layer.

3. The method of claim 2, wherein structuring the insulation layer includes depositing a mask layer.

4. The method of claim 2, wherein structuring the insulation layer includes a photolithographic process.

5. The method of claim 2, wherein structuring the insulation layer includes laser ablation.

6. The method of claim 1, further comprising encapsulating the integrated circuit device.

7. The method of claim 1, wherein the gas-phase deposition includes a chemical vapor deposition (CVD) process.

8. The method of claim 1, wherein the gas-phase deposition includes a plasma enhanced chemical vapor deposition (PE-CVD) process.

9. The method of claim 1, further comprising applying an adhesion promoting layer over the insulation layer.

10. The method of claim 9, wherein applying the adhesion promoting layer includes a gas phase deposition of silane.

11. The method of claim 9, wherein applying an adhesion promoting layer includes a locking plasma treatment process.

12. A method for producing an integrated circuit device, comprising:
    providing a semiconductor chip;
    providing connection points for wire bonds through a metallization layer disposed directly on the semiconductor chip;
    applying an inorganic insulation layer to the metallization layer, wherein the inorganic insulation layer has a temperature stability up to 450-500° C.; and
    forming trenches through the metallization layer to the semiconductor chip.

13. The method of claim 12, wherein the inorganic insulation layer has a thickness between 10 nm and 20 µm.

14. The method of claim 12, further comprising applying an adhesion-promoting layer the insulation layer by a gas phased deposition which promotes adhesion of a molding material insulation layer.

15. The method of claim 12, further comprising applying an adhesion-promoting layer to the insulation layer by a gas phased deposition which promotes adhesion of semiconductor chips.

16. A method for producing an integrated circuit device, comprising:
    providing a semiconductor chip;
    providing a metallization layer having a thickness greater than 10 nm disposed directly on the semiconductor chip; and
    applying an insulation layer directly to the metallization layer by a gas-phase deposition such that the insulation layer contacts the metallization layer, wherein the insulation layer includes a diamond-like carbon (DLC).

17. The method of claim 16, wherein the insulation layer has a thickness of 1 µm.

* * * * *